May 16, 1961 R. C. CARTER ET AL 2,984,794

STABLE F.M. OSCILLATOR

Filed April 7, 1959

INVENTORS
ROBERT C. CARTER
DONATHAN BURNETT
BY
ATTORNEY
AGENT

United States Patent Office 2,984,794

Patented May 16, 1961

2,984,794

STABLE F.M. OSCILLATOR

Robert C. Carter, Richardson, and Donathan Burnett, Dallas, Tex., assignors to Collins Radio Company, Cedar Rapids, Iowa, a corporation of Iowa Filed Apr. 7, 1959, Ser. No. 804,760

5 Claims. (Cl. 332—16)

This invention relates generally to frequency-modulated oscillators and more particularly to a frequency-modulated oscillator of the type employing the capacity of a reverse biased junction diode as a variable reactance element.

In F.M. oscillators of the type employing a varying reactance element whose reactance is varied as a function of the modulating voltage, it is a necessity that means be incorporated whereby the reactance element parameter may be accurately controlled and whereby temperature variations and variation in circuit parameters do not appreciably change the operating point of the reactance element. Junction diodes have been employed in the art as variable reactance elements wherein the diode functions as a variable capacitive reactance as a function of the reverse bias voltage applied across the junction diode. To realize stability in an oscillator employing such a variable reactance element, it is imperative that the back-bias voltage across the diode be accurately maintained and the diode must be so associated with the relating circuitry such that loading and changes in the oscillator operating points do not readily affect the operating point of the reactance diode.

It is an object, therefore, of the present invention to provide a highly stabilized F.M. oscillator employing a transistor and a rector junction diode wherein variations of the transistor operating point due to temperature do not adversely affect the operating point of the reactance diode.

A further object of the present invention is the provision of an oscillator circuit relatively insensitive to loading and in which variation of the operating characteristics of the transistor does not appreciably affect the output.

The invention is featured in the provision of a novel transistor biasing scheme by which exacting control over the amplitude of the RF voltage impressed upon the reactance diode may be realized.

A further feature of the present invention is the provision of a series tuned circuit in the oscillator feedback path to achieve frequency stability.

These and other features and objects of the invention will become apparent from the following description and claims when read in conjunction with the accompanying drawings, in which:

Figure 1:
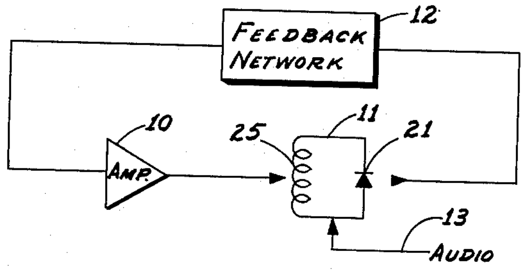
Figure 1 is a functional diagram of the basic elements of the oscillator circuit.

The basic F.M. oscillator of the present invention is shown functionally in Figure 1 and is seen to comprise an amplifier 10 in conjunction with a tuned circuit 11 with a feedback network 12 insert between the tuned circuit 11 and the input of the amplifier 10. The capacitive element of the tuned circuit 11 is a junction diode 21, the capacitive reactance of which varies as a function of the reverse bias voltage applied to the diode. This reverse bias voltage establishes the quiescent capacitive reactance of the diode 21 and means for developing and applying this bias voltage will be further discussed. Figure 1 illustrates functionally the application of an audio source 13 to the tuned circuit 11. Means will be described by which this audio source is superimposed upon the back-bias voltage across the diode 21 to vary the capacitive reactance of the diode 21 as a function of the resulting amplitude variation of the back bias and thereby vary the resonant frequency of the tuned circuit 11 in accordance with the amplitude of the audio signal 13. The carrier frequency is therefore deviated in accordance with the audio signal amplitude to realize a frequency modulated output.

Figure 2:
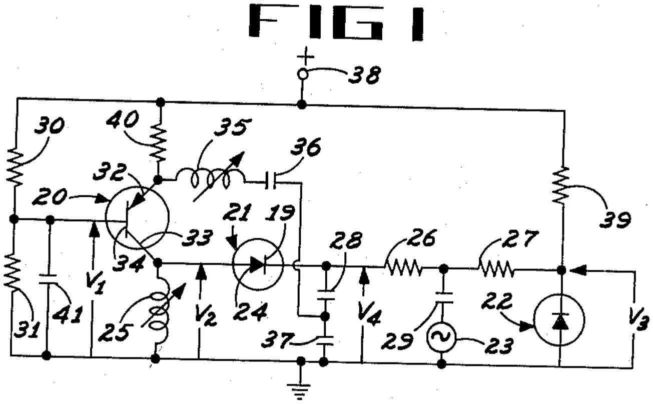
Figure 2 is a schematic diagram of an F.M. oscillator embodiment according to the present invention.

Figure 2 illustrates a schematic of an F.M. oscillator according to the present invention in which a transistor 20 functions as the amplifier device 10 of Figure 1. The base 34 of transistor 20 is connected to the junction of resistors 30 and 31 connected between the positive voltage source 38 and ground. This voltage dividing network biases the base 34 of transistor 20 with respect to the collector 33 by a voltage indicated as $V_1$. Resistor 31 is shunted by a bypass capacitor 41. The emitter 32 of transistor 20 is connected through a resistor 40 to the positive voltage source 38. An RF inductor 25 is connected between the collector 33 and ground. A junction diode 21 is connected serially with capacitors 28 and 37 from the collector 33 to ground thereby shunting the RF inductor 25 to form a parallel tuned circuit which is represented functionally by the tuned circuit 11 of Figure 1. A series tuned circuit comprised of inductor 35 and capacitor 36 is connected between the junction of capacitors 28 and 37 and the emitter 32 of transistor 20. This series tuned circuit functions generally as the feedback network 12 of Figure 1. A zener diode 22 is connected between ground and resistor 39 to the positive voltage source 38. The cathode of the zener diode 22 is shown connected to the cathode of junction diode 21 through resistances 26 and 27. An audio source 23 is serially connected with a capictor 29 between ground and the junction of resistors 26 and 27.

As previously mentioned, the junction diode 21 must at all times have reverse voltage applied to it so that it will act as a variable capacitor rather than rectifying as an ordinary diode. This reverse bias is supplied from zener diode 22 which is chosen to have a near-zero temperature coefficient. Audio voltage from source 23 is introduced at the junction of resistors 26 and 27 and is so chosen in amplitude that a reverse bias voltage is maintained across junction diode 21 at all times. The capacitive reactance of junction diode 21 is therefore proportional to the back-bias voltage and, as such, the resulting reactive capacitance is a function of the quiescent back-bias voltage established by zener diode 22 and of the superimposed audio signal from the audio source 23.

Figure 3:
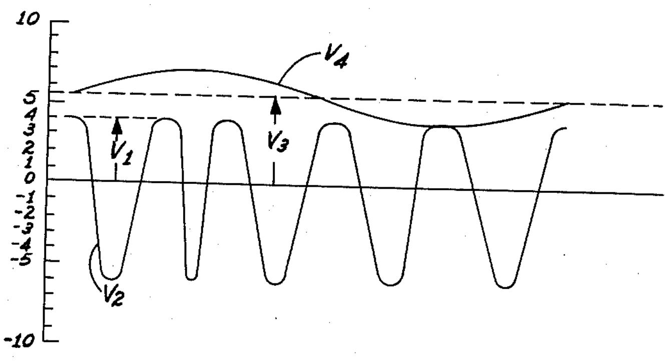
Figure 3 is a graphical represention of operating voltage waveforms realized in the circuitry of Figure 2.

With reference to Figure 3, the voltage established by zener diode 22 is illustrated as the voltage $V_3$. $V_4$ is the resultant voltage applied across junction diode 21 and inductance 25 as a result of the introduction of the audio signal 23. The instantaneous voltage across junction diode 21 equals $V_4$ minus the voltage $V_2$ and for this reason, it is imperative that RF inductance 25 have very little direct current resistance to insure that the back voltage $(V_4-V_2)$ on junction diode 21 is not a function of the operating point of transistor 20.

In operation, the base voltage $V_1$ between base 34 of transistor 20 and ground is set at a lower potential than the zener diode reference voltage $V_3$ by choice of the bleeder network of resistors 30 and 31 between the positive voltage source 38 and ground. Figure 3 illustrates the voltage $V_1$ as being a lower potential than the zener diode reference voltage $V_3$. When oscillating, the collector 33 of transistor 20 canont exceed the base voltage $V_1$ since it becomes forward biased at this point. Thus an important limiting action is achieved whereby the positive peaks of $V_2$ can never exceed $V_1$. Subsequently, diode 21 cannot be forward-biased and at all times functions as the desired reactance element in the circuit. The definite positive limit is illustrated by the waveform $V_2$ appearing across the RF inductor 25. The negative swing of the waveform $V_2$ is determined by the amount of energy stored in the tank circuit comprised of RF conductor 25 and junction diode 21 during the positive cycle. With reference to Figure 2, it is noted that if too large a modulating signal from the audio source 23 is applied, the minimum amplitude of the waveform $V_4$ may be below the maximum peak RF as established by base voltage $V_1$. This is allowable up to about 0.6 volt since silicon diodes do not conduct appreciably until that point. It is seen that the output waveform $V_2$ is a frequency modulated waveform with increased frequency occurring during the highest voltage levels of the instantaneous voltage $(V_4-V_2)$ as it is applied across the junction diode 21. Although the output waveform $V_2$ is a distorted waveform, distortion may be reduced by increasing the Q of RF inductor 25; by reducing the feedback through the series tuned circuit of inductor 35 and capacitance 36; or by filtering the output. The center frequency of the output $V_2$ is determined by both the parallel and series tuned circuits. The tank circuit comprised of junction diode 21 and RF inductor 25 is tuned to the oscillator center frequency and the series feedback arrangement of inductor 35 and capacitor 36 forms another tank circuit likewise tuned to the center frequency.

In a circuit constructed according to the schematic of Figure 2, the cathode of the junction diode 21 was maintained at +5.5 volts through resistors 26 and 27 and the zener diode regulator 22. The base 34 of transistor 20 was maintained at 4 volts positive with respect to ground by means of the divider network 30 and 31 and audio signals of approximately 1-volt R.M.S. were superimposed on the zener diode voltage $V_3$.

The following circuit parameters in accordance with Figure 2 resulted in a stable operating R.M. oscillator circuit:

| | |
|---|---|
| Resistor **30** | 15K ohms. |
| Resistor **31** | 3300 ohms. |
| Resistor **26** | 27K ohms. |
| Resistor **27** | 4.7K ohms. |
| Resistor **40** | 12K ohms. |
| Resistor **39** | 12K ohms. |
| Capacitor **36** | 50 $\mu\mu$fd. |
| Capacitor **41** | 10,000 $\mu\mu$fd. |
| Capacitor **28** | 1,000 $\mu\mu$fd. |
| Capacitor **37** | 5,000 $\mu\mu$fd. |
| Capacitor **29** | .1 $\mu$fd. |
| Inductor **35** | 2 mh. |
| Inductor **25** | 2 mh. |
| Diode **22** | Texas Instruments 652C0. |
| Diode **21** | Pacific semiconductor V68. |
| Transistor **20** | RCA 2N384. |
| Voltage source **38** | 18 volts. |
| Zener diode voltage | 5.5 volts. |

A circuit with the above parameters showed appreciable stability with variation in transistor characteristics. Approximately 15 transistors were placed into the circuit with 1.2 db variation in output. The resulting circuitry was quite insensitive to loading across capacitor 37. A 330 ohm resistor applied across capacitor 37 dropped the output 0.5 db and shifted the frequency 1.8 kc. from a center frequency of 450 kc. The output in this case was 40 mv. The circuit functioned in a stable manner throughout a wide ambient temperature variation; the center frequency shifting less than 300 cycles. One volt R.M.S. of audio signal from source 23 resulted in a plus or minus 10 kc. deviation in the output frequency.

The invention is thus seen to provide a stabilized F.M. oscillator utilizing diodes and transistors wherein output characteristics are essentially unaffected by variation in operating temperatures and transistor characteristics. The novel biasing means for the transistor provides exacting control over the amplitude of the RF voltage impressed upon the reactance diode and thus maintains an accurate output frequency and deviation range over a comparatively wide range of transistor characteristics. Additionally, it may be seen that variations of the transistor operating point due to temperature do not affect the direct current operating point of the reactance diode and, hence, high stability may be realized.

Although this invention has been described with respect to a particular embodiment thereof, it is not to be so limited as changes and modifications may be made therein which are within the full intended scope of the invention as defined by the appended claims.

We claim:

1. A reactance oscillator-modulator of the type providing an output frequency variation about a predetermined center frequency in accordance with a modulating signal amplitude variation comprising a transistor having base, collector and emitter elements, a forward bias source connected between the base of said transistor and ground, an inductance-capacitance shunt circuit connected between said collector element and ground, said shunt circuit including an RF inductor and a junction diode, said junction diode connected to a source of reverse bias voltage, means for superimposing said modulating signal upon said reverse bias voltage, and regenerative feedback means connected between said shunt circuit and the emitter electrode of said transistor, whereby the resonant frequency of said shunt circuit varies as a function of the back bias applied to said junction diode.

2. A reactance oscillator-modulator circuit as described in claim 1 wherein said forward bias source is less than said reverse biasing source and the maximum amplitude of said modulating signal does not exceed the difference between said biasing source magnitudes.

3. A reactance oscillator-modulator circuit as described in claim 2 wherein said regenerative feedback means comprises a second RF inductance member and a capacitance tuned to series resonance at the center frequency of said oscillator and said inductance capacitance shunt circuit is tuned for parallel resonance at said center frequency.

4. A reactance oscillator-modulator circuit as described in claim 3 wherein said reverse bias source comprises a zener diode serially connected between a positive voltage source and ground, and wherein the cathode of said zener diode is connected through first and second resistance members to the cathode of said junction diode and said modulating voltage source is serially connected with a capacitance between the junction of said first and second resistance members and ground.

5. A reactance oscillator-modulator circuit as described in claim 4 wherein said inductance-capacitance shunt circuit comprises said first RF inductance member shunted by said junction diode in series with first and second capacitances to ground and said series resonant regenerative feedback network is connected between the junction of said first and second capacitances and the emitter electrode of said transistor.

References Cited in the file of this patent

UNITED STATES PATENTS

| | | |
|---|---|---|
| 2,473,556 | Wiley | June 21, 1949 |
| 2,859,409 | Cerveny et al. | Nov. 4, 1958 |
| 2,906,968 | Montgomery | Sept. 29, 1959 |